(12) United States Patent
Kim

(10) Patent No.: US 10,749,142 B2
(45) Date of Patent: Aug. 18, 2020

(54) DISPLAY DEVICE

(71) Applicant: Samsung Display Co., Ltd., Yongin-si (KR)

(72) Inventor: Nam Jin Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/239,552

(22) Filed: Jan. 4, 2019

(65) Prior Publication Data

US 2019/0312229 A1 Oct. 10, 2019

(30) Foreign Application Priority Data

Apr. 6, 2018 (KR) .................. 10-2018-0040321

(51) Int. Cl.
| | | |
|---|---|---|
| H01L 51/52 | (2006.01) | |
| H01L 27/32 | (2006.01) | |
| H01L 51/50 | (2006.01) | |

(52) U.S. Cl.
CPC ...... *H01L 51/5256* (2013.01); *H01L 27/3246* (2013.01); *H01L 27/3258* (2013.01); *H01L 51/5012* (2013.01)

(58) Field of Classification Search
None
See application file for complete search history.

(56) References Cited

U.S. PATENT DOCUMENTS

| | | | | |
|---|---|---|---|---|
| 7,816,863 | B2 * | 10/2010 | Yamazaki | ........... H01L 27/3246 |
| | | | | 313/507 |
| 9,356,256 | B2 | 5/2016 | Choi | |
| 2003/0094615 | A1 * | 5/2003 | Yamazaki | ............... H01L 27/12 |
| | | | | 257/72 |
| 2006/0081844 | A1 * | 4/2006 | Hirosue | .................. H01L 27/12 |
| | | | | 257/59 |
| 2016/0111550 | A1 | 4/2016 | Adachi et al. | |
| 2017/0200775 | A1 | 7/2017 | Kim | |
| 2018/0090554 | A1 * | 3/2018 | Choi | ................... H01L 27/3258 |

FOREIGN PATENT DOCUMENTS

| | | |
|---|---|---|
| KR | 10-2016-0080289 | 7/2016 |
| KR | 10-2017-0084413 | 7/2017 |

* cited by examiner

*Primary Examiner* — Ashok Patel
(74) *Attorney, Agent, or Firm* — H.C. Park & Associates, PLC

(57) ABSTRACT

A display device includes: a substrate having: a display area; and a non-display area surrounding the display area; an inorganic layer disposed in the display area and the non-display area, the inorganic layer including openings exposing the substrate; a protruding portion disposed overlapping the openings, the protruding portion contacting the substrate exposed by the openings and including an organic material; and a passivation layer disposed on the inorganic layer, the passivation layer contacting the protruding portion. Such as structure is capable of minimizing or reducing the formation of cracks and preventing or reducing formed cracks from being propagated to the inside of the display device.

20 Claims, 6 Drawing Sheets

DISPLAY DEVICE

CROSS-REFERENCE TO RELATED APPLICATION

This application claims priority from and the benefit of Korean Patent Application No. 10-2018-0040321, filed on Apr. 6, 2018, which is hereby incorporated by reference for all purposes as if fully set forth herein.

BACKGROUND

Field

Exemplary embodiments/implementations of the invention relate to a display device.

Discussion of the Background

With the development of multimedia, display devices are becoming increasingly important. Accordingly, various types of display devices such as organic light emitting displays and liquid crystal displays are being used.

A display device may include a buffer layer made of an inorganic material and a plurality of insulating layers. The buffer layer and the insulating layers prevent electric conduction or penetration of moisture, outside air, impurity ions, etc.

A display device may be subjected to external stress during a manufacturing process. Due to the external stress, cracks may be formed in an inorganic layer, causing the inorganic layer to easily peel off. In addition, as the bezel of the display device is reduced in size, the internal circuit can be easily damaged by the cracks propagated along the inorganic layer.

The above information disclosed in this Background section is only for understanding of the background of the inventive concepts, and, therefore, it may contain information that does not constitute prior art.

SUMMARY

Devices constructed/methods according to exemplary embodiments of the invention are capable of minimizing or reducing the formation of cracks and preventing or reducing formed cracks from being propagated to the inside of the display device.

Additional features of the inventive concepts will be set forth in the description which follows, and in part will be apparent from the description, or may be learned by practice of the inventive concepts.

According to one or more embodiments of the invention, a display device includes: a substrate including: a display area; and a non-display area surrounding the display area; an inorganic layer disposed in the display area and the non-display area, the inorganic layer including openings exposing the substrate; a protruding portion disposed overlapping the openings, the protruding portion contacting the substrate exposed by the openings and including an organic material; and a passivation layer disposed on the inorganic layer, the passivation layer contacting the protruding portion.

The inorganic layer may include a buffer layer.

The display device may further include: a gate insulating layer; and an interlayer insulating layer disposed on the buffer layer, wherein the gate insulating layer and the interlayer insulting layer do not overlap the openings.

The openings may be disposed in the non-display area along the periphery of the substrate.

The display device may further include a pad portion which is disposed on a pad side of the substrate, wherein the openings are disposed on sides other than the pad side.

The openings may be arranged at regular intervals.

The protruding portion may include: a first protrusion; and a second protrusion disposed on the first protrusion.

A maximum width of the second protrusion may be larger than that of the first protrusion.

The second protrusion completely may cover an upper surface and both side surfaces of the first protrusion.

The maximum width of the second protrusion may be smaller than that of the first protrusion.

Side surfaces of the second protrusion may be aligned with the side surfaces of the first protrusion.

The display device may further include: a via layer disposed on the inorganic layer; and a pixel defining layer disposed on the via layer, wherein the via layer and the first protrusion may include the same material.

The passivation layer may include a first inorganic material layer, an organic material layer and a second inorganic material layer stacked sequentially.

The first inorganic material layer and the second inorganic material layer may contact the protruding portion.

An outer side surface of the protruding portions may be disposed closer to the respective sides of the substrate than edges of the first inorganic material layer and the second inorganic layer.

The inorganic layer may include a buffer layer, a gate insulating layer, and an interlayer insulating layer sequentially stacked.

According to one or more embodiments of the invention, a display device includes: a substrate including: a display area; and a non-display area surrounding the display area; an inorganic layer disposed on the substrate, the inorganic layer including openings exposing the substrate in the non-display area; a via layer disposed on the inorganic layer in the display area; a pixel defining layer disposed on the via layer in the display area; a protruding portion overlapping the openings and contacting the substrate exposed through the openings; and a passivation layer disposed on the pixel defining layer, the passivation layer contacting the protruding portion, wherein the protruding portion includes: a first protrusion including the same material as the via layer; and a second protrusion disposed on the first protrusion, the second protrusion including the same material as the pixel defining layer.

The inorganic layer may include a buffer layer.

The passivation layer may include a first inorganic material layer, an organic material layer and a second inorganic material layer sequentially stacked.

An outer side surface of the protruding portions may be disposed closer to the respective sides of the substrate than edges of the first inorganic material layer and the second inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
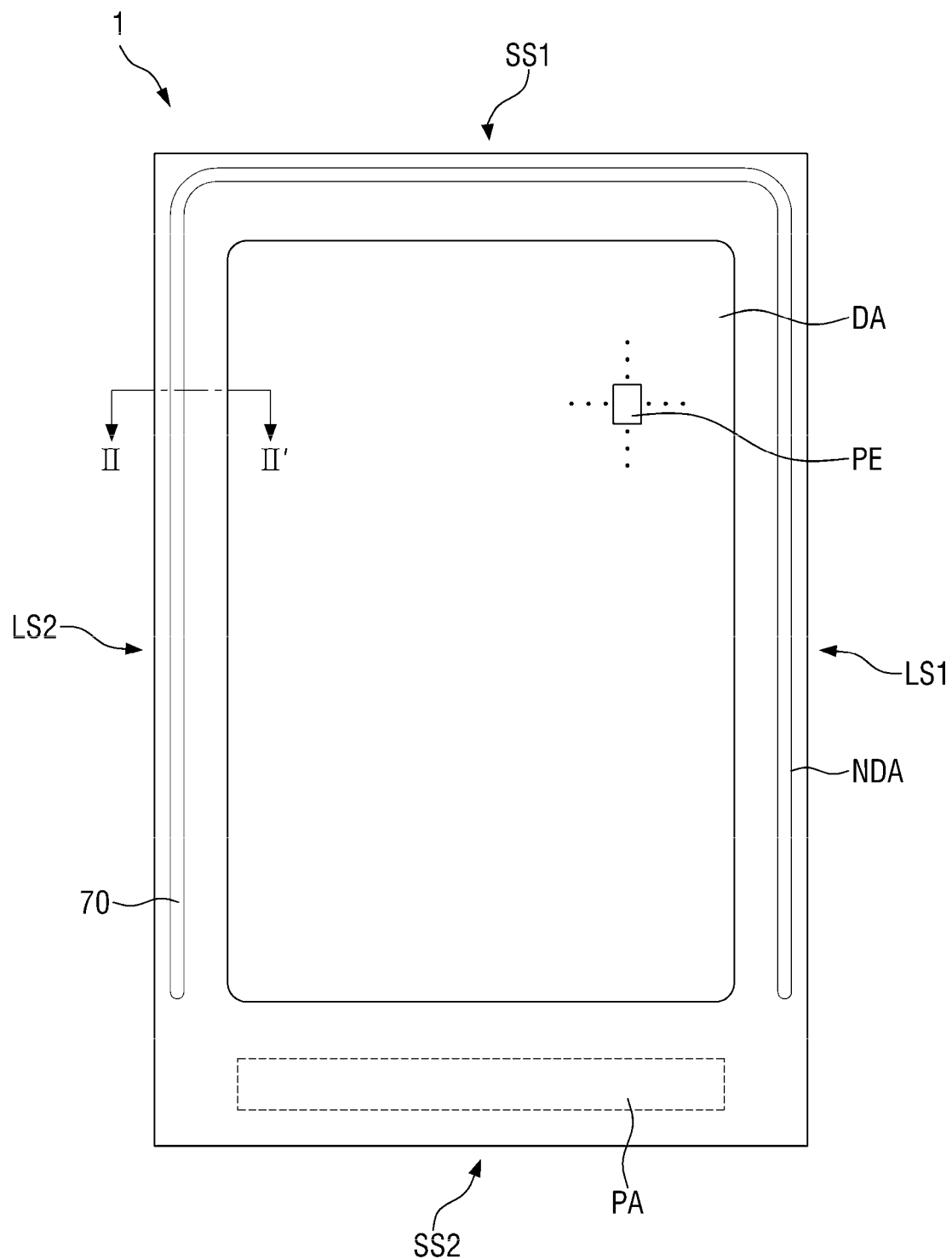
FIG. 1 is a plan layout view of an organic light emitting display according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described with reference to the accompanying drawings.

A display device is a device for displaying a moving image or a still image. The display device can be used as a display screen of not only portable devices such as a mobile phone, a smart phone, a tablet personal computer (PC), a smart watch, a watch phone, a mobile communication terminal, an electronic notebook, an electronic book, a portable multimedia player (PMP), a navigation device and an ultra-mobile PC (UMPC), but also various products such as a television, a notebook, a monitor, a billboard and the Internet of Things (IoT). Examples of the display device include an organic light emitting display, a liquid crystal display (LCD), a plasma display (PDP), a field emission display (FED), and an electrophoretic display (EPD).

An organic light emitting display will hereinafter be described as an example of the display device, but the exemplary embodiments of the present disclosure are not limited to the organic light emitting display.

FIG. 1 is a schematic plan view of an organic light emitting display 1 according to an exemplary embodiment.

Referring to FIG. 1, the organic light emitting display 1 may have a rectangular shape with a first long side LS1 and a second long side LS2 facing each other and a first short side SS1 and a second short side SS2 facing each other in plan view. However, the display device 1 according to the exemplary embodiments is not limited to the rectangular shape and can have various shapes such as a circular shape and a square shape.

The display device 1 includes a display area DA and a non-display area NDA disposed around the display area DA.

The display area DA refers to an area for displaying a screen. The planar shape of the display area DA may be a rectangular shape or may be a rectangular shape with rounded corners. The planar shape of the display area DA is not limited to the rectangular shape, but may be a circular shape, an elliptical shape, or various other shapes. The display area DA includes an active area including a plurality of pixels PE.

The non-display area NDA is disposed around the display area DA. The non-display area NDA may form edges of the organic light emitting display 1.

A driver PA for driving pixel circuits of the display area DA may be disposed in the non-display area NDA. The driver PA may include a driving circuit and a driving wiring for transmitting a driving signal. In an exemplary embodiment, the driver PA may be disposed in the non-display area NDA adjacent to the second short side SS2.

In an exemplary embodiment, a part of the non-display area NDA of the organic light emitting display 1 may be bent or curved. For example, the non-display area NDA of the second short side SS2 may be bent or curved. A bent region may extend, from a flat region, in a direction opposite to a display direction, i.e. towards the back of organic light emitting display 1 when the organic light emitting display 1 is a front emission type display. If at least a part of the non-display area NDA is bent or curved in the direction opposite to the display direction toward the back of the display, the bezel of the organic light emitting display 1 can be reduced.

A protruding portion 70 may be disposed in peripheral regions of the non-display area NDA which are adjacent to the first long side LS1, the second long side LS2 and the first short side SS1. This will be described in detail with reference to FIG. 2.

Figure 2:
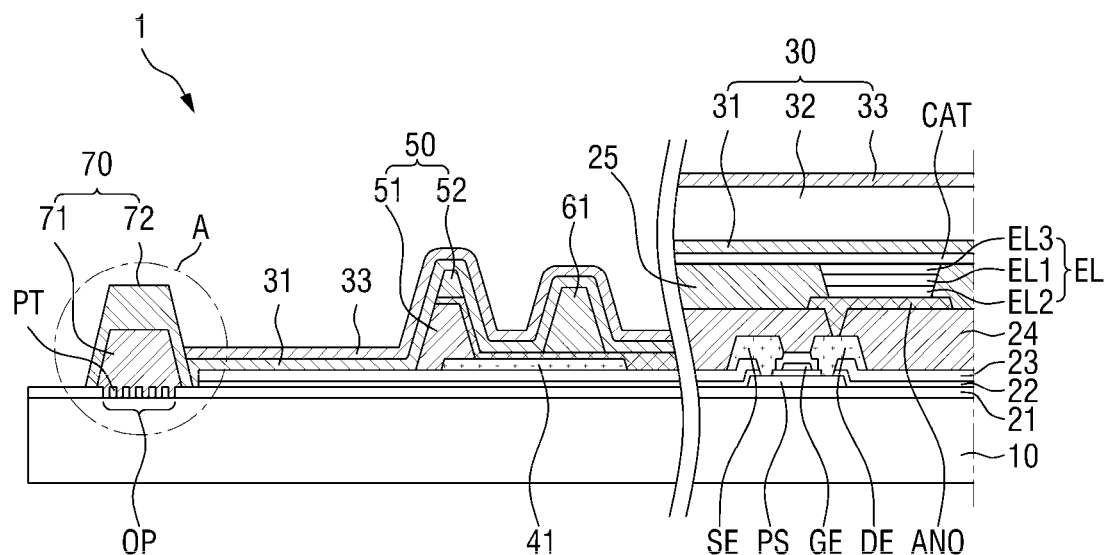
FIG. 2 is a cross-sectional view taken along sectional line II-II' of FIG. 1, according to an exemplary embodiment.

FIG. 2 is a cross-sectional view taken along sectional line II-II' of FIG. 1, according to an exemplary embodiment.

Referring to FIG. 2, the organic light emitting display 1 includes a substrate 10, at least one thin-film transistor TFT formed on the substrate 10, and an organic light emitting diode OLED. The thin-film transistor TFT includes a semiconductor layer PS, a gate electrode GE, a source electrode SE, and a drain electrode DE. The organic light emitting diode OLED includes an anode ANO, a cathode CAT, and an organic layer EL disposed between the anode ANO and the cathode CAT.

The substrate 10 supports layers disposed on the substrate 10. The substrate 10 may be made of an insulating material. The substrate 10 may be made of an inorganic material such as glass or quartz or may be made of an organic material such as polyimide. The substrate 10 may be a rigid substrate or a flexible substrate.

A buffer layer 21 is disposed on the substrate 10. The buffer layer 21 may prevent or reduce diffusion of impurity ions, prevent or reduce penetration of moisture or outside air, and perform a surface planarization function. The buffer layer 21 may be made of an insulating material and may include silicon nitride, silicon oxide, or silicon oxynitride.

The buffer layer 21 may include a plurality of openings OP in the peripheral regions adjacent to both long sides LS1 and LS2 and on the first short side SS1 of the display device 1. This will be described in detail later.

The semiconductor layer PS is disposed on the buffer layer 21. The semiconductor layer PS forms a channel of the thin-film transistor TFT. The semiconductor layer PS may include polycrystalline silicon. Portions (source and drain regions) of the semiconductor layer PS which are connected to the source and drain electrodes SE and DE of the thin-film transistor TFT may be doped with impurity ions (p-type impurity ions in the case of a PMOS transistor). A trivalent dopant such as boron (B) may be used as the p-type impurity ions. In an exemplary embodiment, the semiconductor layer PS may include monocrystalline silicon, low-temperature polycrystalline silicon, amorphous silicon, or an oxide semiconductor such as ITZO or IGZO.

A gate insulating layer 22 is disposed on the semiconductor layer PS.

A gate conductive layer is disposed on the gate insulating layer 22. The gate conductive layer includes the gate electrode GE of the thin-film transistor TFT. In addition, the gate conductive layer may include a scan signal line for transmitting a scan signal to the gate electrode GE.

An interlayer insulating layer 23 is disposed on the gate conductive layer.

Each of the gate insulating layer 22 and the interlayer insulating layer 23 may include an inorganic material such as silicon oxide, silicon nitride, or silicon oxynitride.

A source/drain conductive layer is disposed on the interlayer insulating layer 23. The source/drain conductive layer may include the source electrode SE and the drain electrode DE of the thin-film transistor TFT and a power supply voltage electrode 41. The source electrode SE and the drain electrode DE of the thin-film transistor TFT may be electrically connected to the source region and the drain region of the semiconductor layer PS through contact holes formed through the interlayer insulating layer 23 and the gate insulating layer 22.

The source/drain conductive layer may include one or more of aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and molybdenum (Mo). The source/drain conductive layer may be a single layer or a multilayer.

A via layer 24 is disposed on the source/drain conductive layer.

The anode ANO is disposed on the via layer 24. The anode ANO may be connected to the drain electrode DE through a contact hole passing through the via layer 24.

A pixel defining layer 25 may be disposed on the anode ANO. The pixel defining layer 25 may include an opening exposing the anode ANO. The pixel defining layer 25 may be made of an organic insulating material or an inorganic insulating material.

The organic layer EL is disposed in the opening of the pixel defining layer 25. The organic layer EL may include an organic light emitting layer EL1, a hole injection/transport layer EL2, and an electron injection/transport layer EL3. Although each of the hole injection/transport layer EL2 and the electron injection/transport layer EL3 is illustrated as a single layer in the drawing, it can be formed as a stack of an injection layer and a transport layer. In addition, at least one of the hole injection/transport layer EL2 and the electron injection/transport layer EL3 may be a common layer disposed over a plurality of pixels.

The cathode CAT is disposed on the organic layer EL and the pixel defining layer 25. The cathode CAT may be a common electrode disposed over a plurality of pixels.

A passivation layer 30 may be disposed on the cathode CAT. The passivation layer 30 includes an inorganic material. The passivation layer 30 may include a plurality of stacked layers. For example, the passivation layer 30 may include a first inorganic material layer 31, an organic material layer 32, and a second inorganic material layer 33 stacked sequentially.

In an exemplary embodiment, the first and second inorganic material layers 31 and 33 may include one or more of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON). The first inorganic material layer 31 and the second inorganic material layer 33 may include the same material or different materials.

The organic material layer 32 may include one or more of polymethylmethacrylate (PMMA), polycarbonate, polystyrene, acrylic resin, epoxy resin, polyimide, and polyethylene.

The display device 1 may further include a plurality of dams 50 and 61 in the non-display area NDA. The dams 50 and 61 may surround at least part of the display area DA. In an exemplary embodiment, the dams 50 and 61 may partially overlap the power supply voltage electrode 41.

When the passivation layer 30 includes an organic material, the dams 50 and 61 may prevent or reduce the organic material layer 32 from flowing toward an edge of the substrate 10, thereby preventing or reducing the formation of an edge tail of the organic material layer 32. Accordingly, the first and second inorganic material layers 31 and 33 of the passivation layer 30 may be formed wider than the organic material layer 32 and may cover the dams 50 and 61. Since the organic material layer 32 is prevented or reduced from flowing to the edge of the substrate 10 by the dams 50 and 61, it may be positioned inside the dams 50 and 61. The first and second inorganic material layers 31 and 33 overlap the dams 50 and 61 and extend further outward to prevent or reduce penetration of external moisture through the sides.

The dams 50 and 61 may include the first dam 50 and the second dam 61. The first dam 50 may include a first sub-layer 51 and a second sub-layer 52.

The first sub-layer 51 may be in direct contact with an outer edge of the power supply voltage electrode 41. The second sub-layer 52 is disposed on the first sub-layer 51, and at least a portion of the second sub-layer 52 overlaps the first sub-layer 51. The anode ANO may be disposed between the first sub-layer 51 and the second sub-layer 52.

The second dam 61 is disposed inside the first dam 50. That is, the second dam 61 may be disposed closer to the display area DA than the first dam 50. The whole of the second dam 61 may overlap the power supply voltage electrode 41, and the second dam 61 may be disposed on the anode ANO.

In FIG. 2, the first dam 50 is composed of two layers, and the second dam 61 is formed as a single layer. However, the shapes of the first and second dams 50 and 61 are not limited to the above example. For example, each of the first and second dams 50 and 61 may be composed of three or more layers. Alternatively, the first dam 50 may be formed as a single layer, and the second dam 61 may be composed of a plurality of layers.

The first sub-layer 51 may be made of the same material as the via layer 24. The second sub-layer 52 and the second dam 61 may be made of the same material as the pixel defining layer 25. Like the via layer 24 and the pixel defining layer 25, the first sub-layer 51, the second sub-layer 52, and the second dam 61 may be organic layers including an organic insulating material. The organic insulating material has better adhesion to a metal than to an inorganic material that forms the gate insulating layer 22 and the interlayer insulating layer 23. Therefore, the first sub-layer 51, the second sub-layer 52 and the second dam 61 may be formed to overlap the power supply voltage electrode 41 and the anode ANO made of a metal material. In so doing, the first sub-layer 51, the second sub-layer 52 and the second dam 61 can be stably formed with excellent adhesion strength.

The protruding portion 70 is disposed outside the first and second dams 50 and 61. The protruding portion 70 will now be described in detail with reference to FIG. 3.

Figure 3:
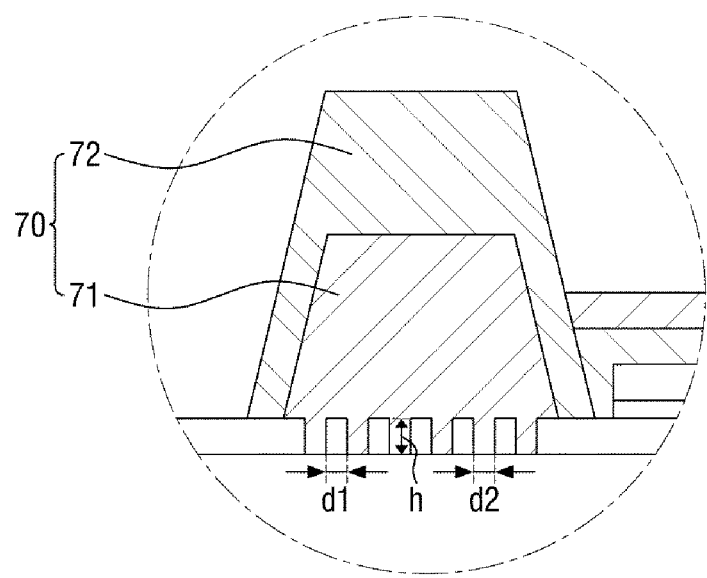
FIG. 3 is an enlarged view of a region A of FIG. 2.

FIG. 3 is an enlarged view of a region A of FIG. 2.

Referring to FIG. 3, the protruding portion 70 may overlap the openings OP described above and may be disposed on an outermost side of the substrate 10.

The openings OP are formed in the buffer layer 21 and expose an upper surface of the substrate 10. The openings OP are spaced apart from each other, and protruding patterns PT are formed in the buffer layer 21 by the openings OP.

The buffer layer 21 is disposed on the entire surface of the substrate 10 but includes the protruding patterns PT arranged at regular intervals in peripheral regions of at the edge of the substrate 10 or periphery of the substrate 10. The buffer layer 21 is discontinuous in a region where the protruding patterns PT are disposed. The buffer layer 21 disposed outside the protruding patterns PT and the buffer layer 21 disposed inside the protruding patterns PT are disconnected from each other.

The gate insulating layer 22 and the interlayer insulating layer 23 are formed relatively further in than the protruding patterns PT. Therefore, the gate insulating layer 22 and the interlayer insulating layer 23 may not overlap the protruding patterns PT of the buffer layer 21.

A width d1 of each protruding pattern PT may be about 1 μm to about 6 μm. A distance d2 between the protruding patterns PT, that is, a width d2 of each opening OP may be about 1 μm to about 6 μm. The width d1 of each protruding pattern PT and the width d2 of each opening OP may be equal to each other. In an exemplary embodiment, the width d1 of each protruding pattern PT and the width d2 of each opening OP may all be 5 μm. Alternatively, the width d1 of each protruding pattern PT and the width d2 of each opening OP may be different from each other.

The protruding portion 70 is disposed on the protruding patterns PT. The protruding portion 70 may completely cover the protruding patterns PT and contact the upper surface of the substrate 10 exposed by the openings OP. That is, the protruding portion 70 may fill the spaces between the openings OP. As will be described later, the protruding portion 70 may include an organic material. Since the adhesion between an organic material and an organic material is better than the adhesion between an organic material and an inorganic material, the protruding portion 70 may have better adhesion with the substrate 10 including an organic material than to the buffer layer 21 including an inorganic material. Accordingly, when the protruding portion 70 directly contacts the upper surface of the substrate 10 exposed through the openings OP, the adhesion of the protruding portion 70 is greater than when otherwise, and thus the protruding portion 70 can be formed stably.

The protruding portion 70 may be a single layer or may be composed of a plurality of layers. In an exemplary embodiment, the protruding portion 70 may include a first protrusion 71 disposed at a relatively lower position and a second protrusion 72 disposed at a relatively higher position. Alternatively, the protruding portion 70 may be composed of three or more layers. In this case, the protruding portion 70 may include a first protrusion disposed at a relatively lowermost position, a third protrusion disposed at a relatively uppermost position, and a second protrusion disposed between the first protrusion and the third protrusion.

The first protrusion 71 may cover all of the protruding patterns PT and fill all the spaces between the openings OP. The second protrusion 72 may be disposed on the first protrusion 71 and may be wider than the first protrusion 71. The second protrusion 72 may completely cover the first protrusion 71, and the first protrusion 71 may not be exposed to the outside.

A distance from the upper surface of the substrate 10 to an upper surface of the second protrusion 72 may be greater than a distance from the upper surface of the substrate 10 to an upper surface of the first protrusion 71. That is, the total height of the protruding portion 70 may be greater when the first protrusion 71 and the second protrusion 72 are disposed than when only the first protrusion 71 is disposed.

The protruding portion 70 includes an organic material having a higher buffering effect and higher impact resistance than an inorganic material. For example, the protruding portion 70 may be made of the same material as the via layer 24 and the pixel defining layer 25 including an organic material. In an exemplary embodiment, the first protrusion 71 may be made of the same material as the via layer 24, and the second protrusion 72 may be made of the same material as the pixel defining layer 25.

The protruding portion 70 may be formed at the same time as the via layer 24 and/or the pixel defining layer 25, respectively. For example, the first protrusion 71 may be formed at the same time as the via layer 24, and the second protrusion 72 may be formed at the same time as the pixel defining layer 25.

In order to manufacture the display device 1, a plurality of elements (e.g., the thin-film transistor TFT, the organic light emitting diode OLED, the passivation layer 30, and the driver PA) corresponding to the display area DA and the non-display area NDA may be formed on a mother substrate, and then the mother substrate may be cut into separate display devices 1. High stress may be concentrated on a region that is cut in the process of cutting the mother substrate. Thus, cracks may be formed in inorganic material layers (e.g., the buffer layer 21, the gate insulating layer 22, the interlayer insulating layer 23, etc.). More specifically, for example, if the mother substrate is flexible, it may be cut by a press method using a cutting knife. In the press method, when the cutting knife directly cuts the inorganic material layers, bending stress may be generated in the mother substrate. As a result, the inorganic material layers having high brittleness may be broken, and cracks may be formed in the inorganic material layers.

When the cracks are formed, the inorganic material layers may easily peel off. Thus, the function of each inorganic material layer may deteriorate. In addition, the cracks may be propagated to the display area DA through the inorganic material layers, adversely affecting wirings constituting the thin-film transistor TFT.

According to the exemplary embodiment, the openings OP are formed in the buffer layer 21 in a region closest to the cut region, discontinuing the buffer layer 21. Therefore, the cracks formed in the cut region can be prevented or reduced from propagating toward the inside of the display device 1. In addition, since the gate insulating layer 22 and the interlayer insulating layer 23 made of an inorganic material are disposed further in than the openings OP as described above, they do not directly receive the stress due to the cutting. Accordingly, cracks are hardly likely to be formed in the gate insulating layer 22 and the interlayer insulating layer 23.

In addition, since the protruding portion 70 overlapping the openings OP includes an organic material having a greater buffering effect and higher impact resistance than an inorganic material, it can mitigate the external stress applied to the buffer layer 21 in the cut region.

Therefore, since the openings OP and the protruding portion 70 mitigate the stress applied to the cut region in the process of cutting the mother substrate and prevent or reduce the propagation of cracks, the durability of the display device 1 can be improved.

The first inorganic material layer 31 and the second inorganic material layer 33 including an inorganic material in the passivation layer 30 may contact a side surface of the protruding portion 70. Specifically, when the protruding portion 70 includes an inner side surface located at a relatively inner position and an outer side surface located at a relatively outer position closer to the respective sides of the substrate 10, the first inorganic material layer 31 and the second inorganic material layer 33 may contact the inner side surface of the protruding portion 70. More specifically, the first inorganic material layer 31 and the second inorganic material layer 33 may contact the inner surface of the second protrusion 72.

In general, the first inorganic material layer 31 and the second inorganic material layer 33 may be formed by depositing an inorganic material using a chemical vapor deposition (CVD) method. Since the inorganic material that forms the passivation layer 30 is applied in a gaseous state, if there is a space between a deposition mask used in chemical vapor deposition and the protruding portion 70, the inorganic material may diffuse into the space to extend outward beyond the protruding portion 70.

The inorganic material extending outward beyond the protruding portion 70 is thinner than the first inorganic material layer 31 and the second inorganic material layer 33 and has lower adhesive strength. Thus, the inorganic material may easily peel off, allowing moisture and outside air to be easily introduced into the display device 1.

In order to prevent or reduce the inorganic material from diffusing beyond the protruding portion 70, the inorganic material may be deposited after securing a margin by placing the deposition mask to extend further than the protruding portion 70. In this case, however, the width of the non-display area NDA may be increased by the margin, and therefore, the bezel size may increase.

On the other hand, if the inorganic material is deposited after the height of the protruding portion 70 is increased and the deposition mask is closely attached to an upper surface of the protruding portion 70, it is possible to prevent or reduce the inorganic material from diffusing beyond the protruding portion 70 without securing a margin. Therefore, the width of the non-display area NDA can be reduced. When the protruding portion 70 is composed of a plurality of layers, it is easier to increase the height of the protruding portion 70 than when the protruding portion 70 is formed as a single layer.

Hereinafter, protruding patterns and protruding portions of display devices according to embodiments will be described. In the following embodiments, a description of elements identical to those of the above-described embodiment will be omitted or simplified, and differences from the above-described embodiment will be mainly described.

Figure 4:
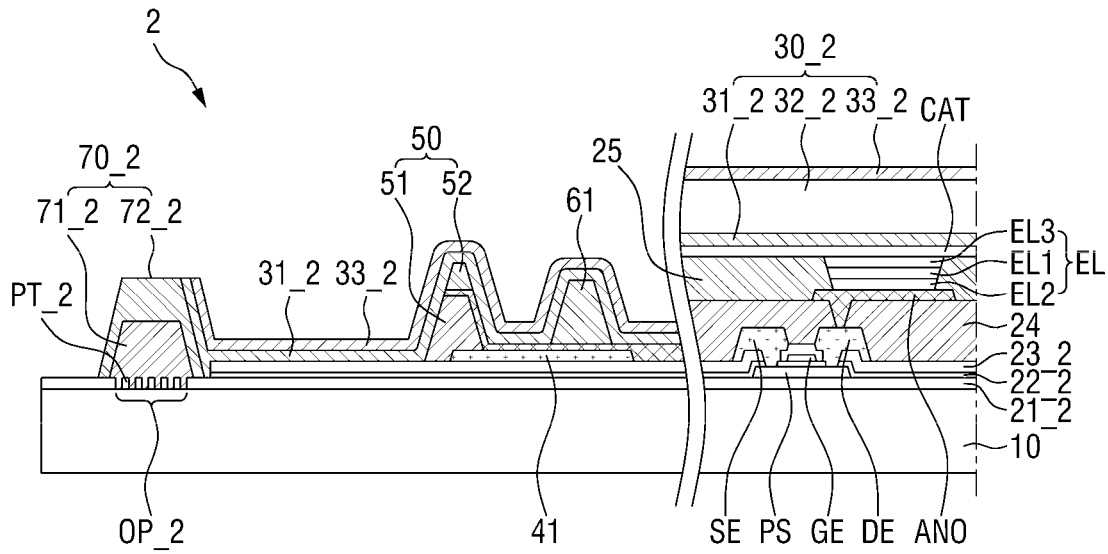
FIGS. 4 and 5 are cross-sectional views of display devices according to exemplary embodiments.
Figure 5:
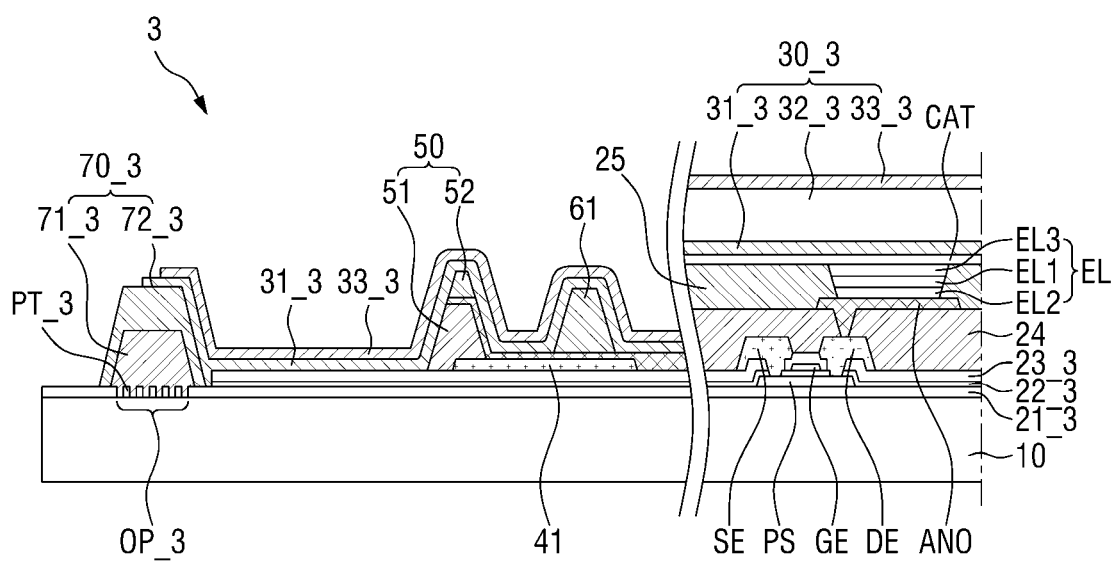

FIGS. 4 and 5 are cross-sectional views of display devices 2 and 3 according to exemplary embodiments.

Referring to FIG. 4, the display device 2 according to the current embodiment is different from the display device 1 according to the exemplary embodiment of FIG. 2 in that a first inorganic material layer 31_2 and a second inorganic material layer 33_2 of a passivation layer 30_2 extend to an inner side surface of a protruding portion 70_2.

The first inorganic material layer 31_2 and the second inorganic material layer 33_2 may cover the entire inner side surface of a second protrusion 72_2. Edges of the first inorganic material layer 31_2 and the second inorganic material layer 33_2 may be aligned with an upper surface of the second protrusion 72_2. However, the present disclosure is not limited to this case, and the first inorganic material layer 31_2 and the second inorganic material layer 33_2 can be disposed on only a part of the inner side surface of the second protrusion 72_2, instead of the entire inner side surface.

Referring to FIG. 5, the display device 3 according to the current embodiment is specifically different from the display device 2 according to the exemplary embodiment of FIG. 4 in that edges of a first inorganic material layer 31_3 and a second inorganic material layer 33_3 of a passivation layer 30_3 are disposed on an upper surface of a protruding portion 70_3.

The edges of the first inorganic material layer 31_3 and the second inorganic material layer 33_3 may be disposed on an upper surface of a second protrusion 72_3. That is, the first inorganic material layer 31_3 and the second inorganic material layer 33_3 may cover an inner side surface of the second protrusion 72_3 and extend further outward to cover a part of the upper surface of the second protrusion 72_3.

The edge of the second inorganic material layer 33_3 may be disposed on the first inorganic material layer 31_3. However, the present disclosure is not limited to this case, and the edge of the second inorganic material layer 33_3 may also be aligned with the edge of the first inorganic material layer 31_3 or may cover the edge of the inorganic material layer 31_3 and extend further outward to contact the upper surface of the second protrusion 72_3.

Figure 6:
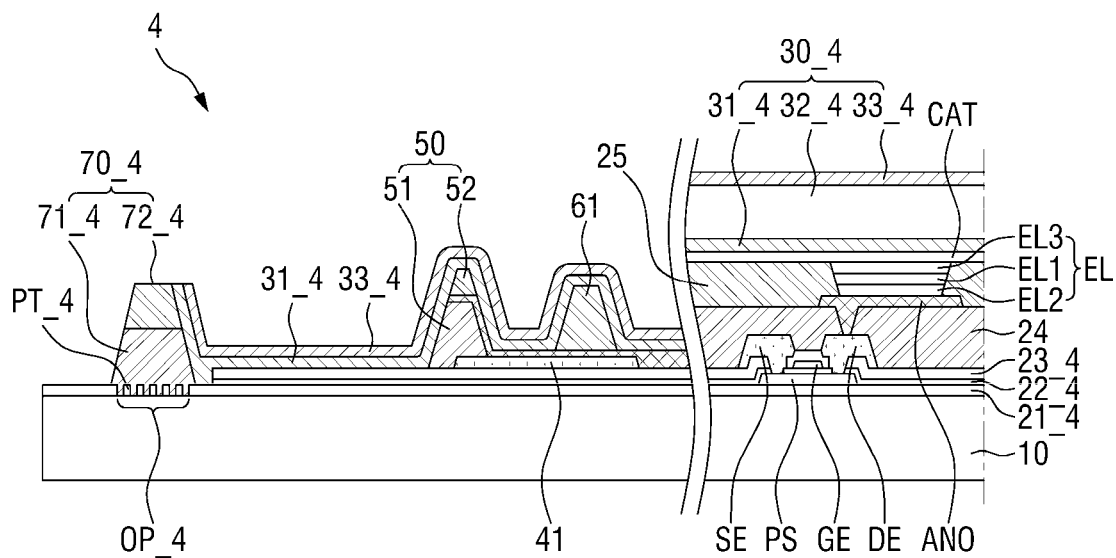
FIGS. 6, 7, and 8 are cross-sectional views of display devices according to exemplary embodiments.
Figure 7:
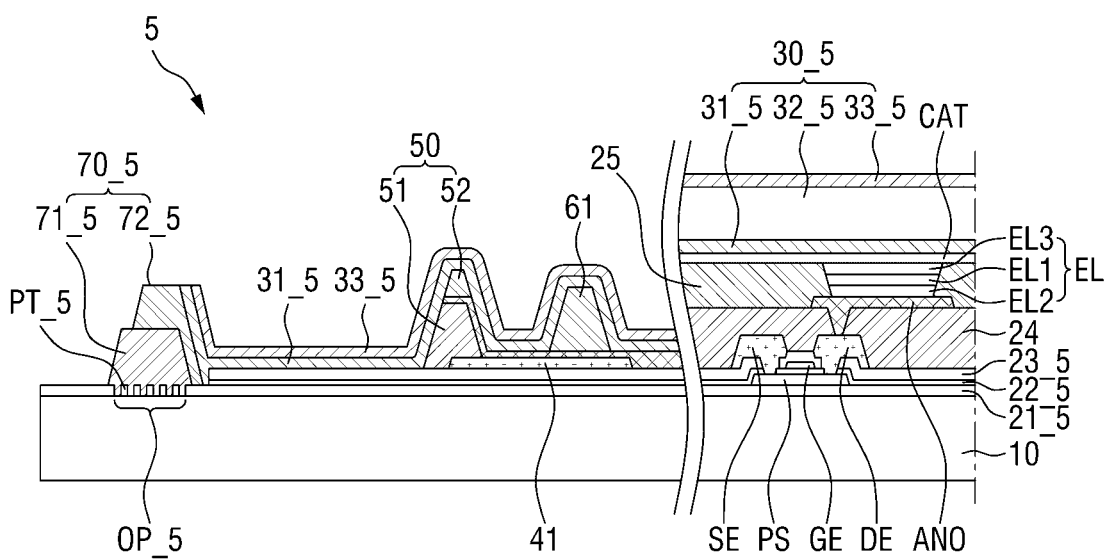
Figure 8:
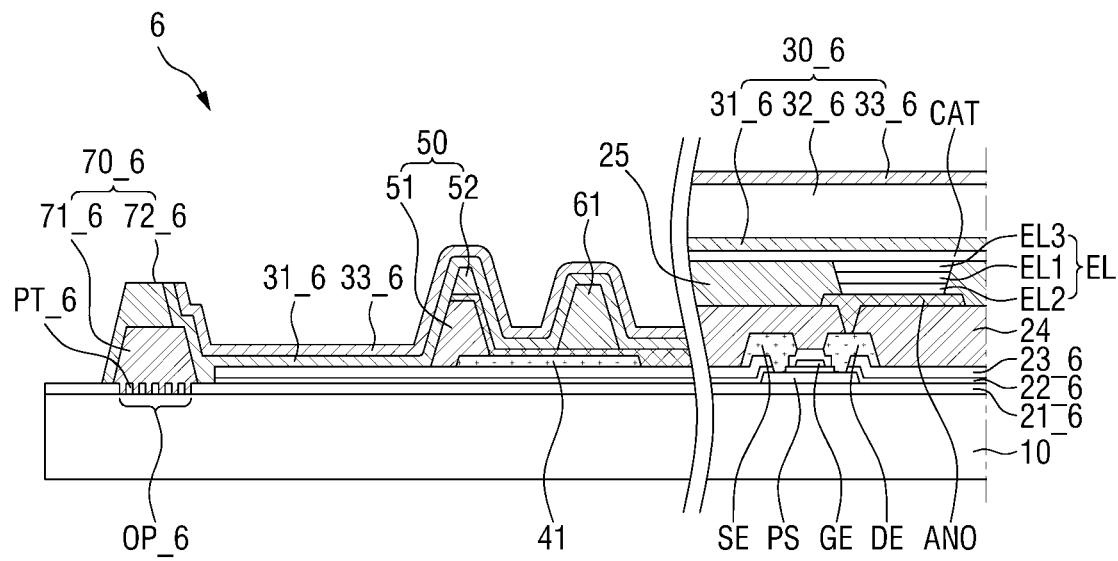

FIGS. 6, 7, and 8 are cross-sectional views of display devices 4, 5, and 6 according to exemplary embodiments.

In the display devices 4, 5, and 6 of FIGS. 6, 7, and 8, first inorganic material layers 31_4, 31_5, and 31_6 and second inorganic material layers 33_4, 33_5, and 33_6 of passivation layers 30_4, 30_5, and 30_6 cover the entire inner side surfaces of protruding portions 70_4, 70_5, and 70_6 as in the exemplary embodiment of FIG. 4. However, the present disclosure is not limited to this case, and the arrangement in the exemplary embodiment of FIG. 2 or 5 can be applied.

Referring to FIG. 6, the display device 4 according to the current embodiment is different from the display device 1 according to the exemplary embodiment of FIG. 2 in that a second protrusion 72_4 does not cover both side surfaces of a first protrusion 71_4.

A maximum width of the second protrusion 72_4 may be smaller than a maximum width of the first protrusion 71_4. The exemplary embodiment of FIG. 6 is different from the exemplary embodiment of FIG. 2 in which the maximum width of the second protrusion 72 in the display device 1 is larger than the maximum width of the first protrusion 71.

Side surfaces of the second protrusion 72_4 may be substantially aligned with the side surfaces of the first protrusion 71_4. The side surfaces of the first protrusion 71_4 and the second protrusion 72_4 may form one continuous plane. In this case, an upper surface of the first protrusion 71_4 is completely covered by the second protrusion 72_4 and is not exposed to the outside. However, the present disclosure is not limited to this case, and the side surfaces of the second protrusion 72_4 may also be disposed on the upper surface of the first protrusion 71_4. That is, the second protrusion 72_4 may be disposed on only a part of the upper surface of the first protrusion 71_4, and a part of the upper surface of the first protrusion 71_4 may be exposed to the outside. The exposed part of the upper surface of the first protrusion 71_4 may contact the first inorganic material layer 31_4.

Referring to FIG. 7, a second protrusion 72_5 may cover an inner side surface of a first protrusion 71_5 but may not cover an outer side surface of the first protrusion 71_5. The display device 5 of FIG. 7 is specifically different from the display device 5 of FIG. 6 in which the second protrusion 72_4 does not cover both side surfaces of the first protrusion 71_4.

The second protrusion 72_5 completely covers the inner side surface of the first protrusion 71_5. However, an outer side surface of the second protrusion 72_5 may be disposed on an upper surface of the first protrusion 71_5 to expose the outer side surface of the first protrusion 71_5.

If the second protrusion 72_5 has better adhesion to the first inorganic material layer 31_5 than the first protrusion 71_5, the protruding portion 70_5 can be more stably disposed when the first inorganic material layer 31_5 contacts only the second protrusion 72_5 as in the current embodiment than when the first inorganic material layer 31_5 contacts the first protrusion 71_5 as well.

Referring to FIG. 8, in the display device 6, a second protrusion 72_6 may cover an outer side surface of a first protrusion 71_6 but may not cover an inner side surface of the first protrusion 71_6.

An inner side surface of the second protrusion 72_6 may be disposed on an upper surface of the first protrusion 71_6. However, the present disclosure is not limited to this case, and the inner side surface of the second protrusion 72_6 may also be aligned with the inner side surface of the first protrusion 71_6.

The first inorganic material layer 31_6 may contact both the first protrusion 71_6 and the second protrusion 72_6.

Since the protruding portion 70_6 may have increased stability when the second protrusion 72_6 completely covers the outer side surface of the first protrusion 71_6, it can remain stably attached onto a substrate 10 even if stress is transmitted from an outermost side of the display device 6.

Figure 9:
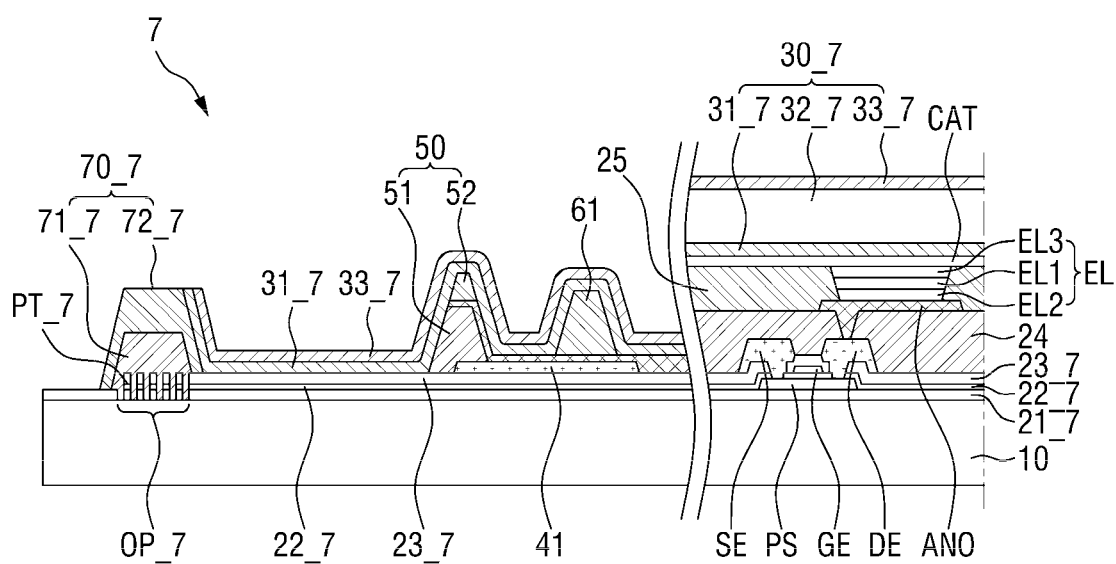
FIGS. 9, 10, and 11 are cross-sectional views of display devices according to exemplary embodiments.
Figure 10:
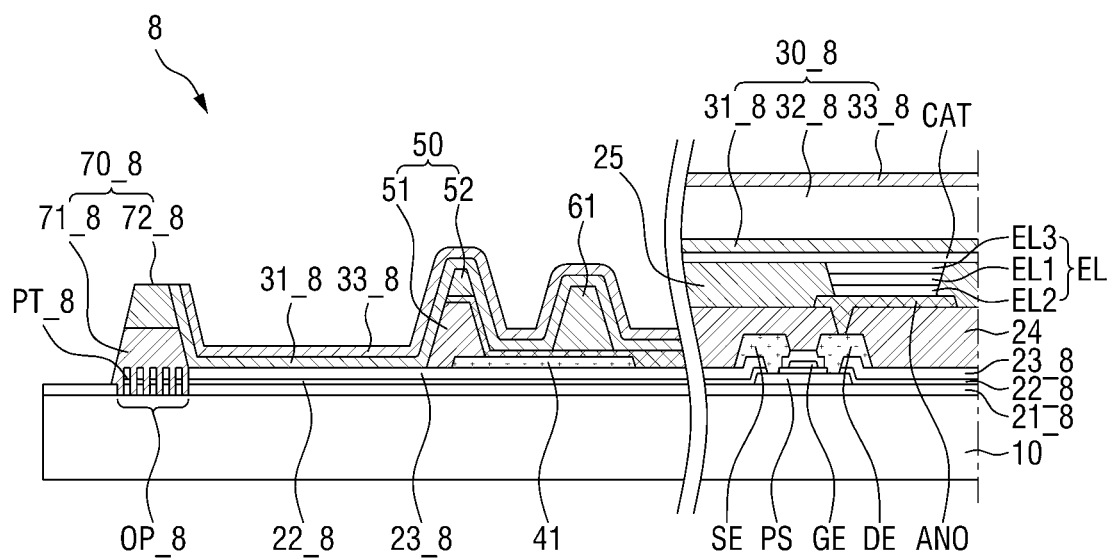
Figure 11:
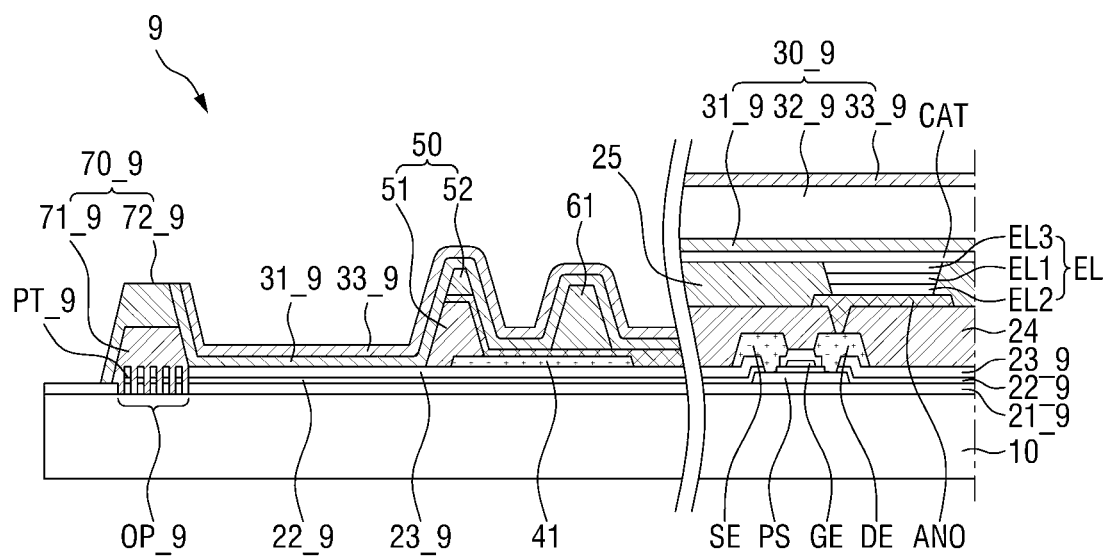

FIGS. 9, 10, and 11 are cross-sectional views of display devices 7, 8, and 9 according to exemplary embodiments.

In the display devices 7, 8, and 9 of FIGS. 9, 10, and 11, first inorganic material layers 31_7, 31_8, and 31_9 and second inorganic material layers 33_7, 33_8, and 33_9 of passivation layers 30_7, 30_8, and 30_9 cover the entire inner side surfaces of protruding portions 70_7, 70_8, and 70_9 as in the exemplary embodiment of FIG. 4. However, the present disclosure is not limited to this case, and the arrangement in the exemplary embodiment of FIG. 2 or 5 can be applied.

Referring to FIGS. 9, 10, and 11, gate insulating layers 22_7, 22_8, and 22_9 and interlayer insulating layers 23_7, 23_8, and 23_9 of the display devices 7, 8 and 9 may extend further outward. Therefore, openings OP_7, OP_8, and OP_9 may be formed in the gate insulating layers 22_7, 22_8, and 22_9 and the interlayer insulating layers 23_7, 23_8, and 23_9. In this case, the openings OP_7, OP_8, and OP_9 may also be formed in buffer layers 21_7, 21_8, and 21_9 to expose upper surfaces of substrates 10. The exposed upper surfaces of the substrates 10 may contact the protruding portions 70_7, 70_8, and 70_9.

In FIGS. 9, 10, and 11, the openings OP_7, OP_8, and OP_9 are formed in both the gate insulating layers 22_7, 22_8, and 22_9 and the interlayer insulating layers 23_7, 23_8, and 23_9. However, the present disclosure is not limited to this case. For example, edges of the interlayer insulating layers 23_7, 23_8, and 23_9 may be disposed further in than the openings OP_7, OP_8, and OP_9, and the openings OP_7, OP_8, and OP_9 may be formed only in the gate insulating layers 22_7, 22_8, and 22_9 and the buffer layers 21_7 and 21_8, and 21_9.

Protruding patterns PT_7, PT_8, and PT_9 formed by the openings OP_7, OP_8, and OP_9 may include all of the buffer layers 21_7, 21_8, and 21_9, the gate insulating layers 22_7, 22_8, and 22_9 and the interlayer insulating layers 23_7, 23_8, and 23_9.

As heights of the protruding patterns PT_7, PT_8, and PT_9 increase, widths d1 of the protruding patterns PT_7, PT_8, and PT_9 and distances d2 between the protruding patterns PT_7, PT_8, and PT_9 may be adjusted so that the spaces between the protruding patterns PT_7, PT_8, and PT_9 are filled with the protruding portions 70_7, 70_8, and 70_9. For example, both the widths d1 of and the distances d2 between the protruding patterns PT_7, PT_8, and PT_9 may be increased.

In FIGS. 9, 10, and 11, only some limited examples of the shapes and arrangement relationships of the protruding portions 70_7, 70_8, and 70_9, the first inorganic material layers 31_7, 31_8, and 31_9, and the second inorganic material layers 33_7, 33_8, and 33_9 are illustrated. It should be understood that all the arrangement shapes and arrangement relationships mentioned in FIGS. 1, 2, 3, 4, 5, 6, 7, and 8 can be applied.

According to embodiments, the propagation of cracks into a display device can be prevented or reduced by forming openings in an inorganic material. In addition, since a substrate exposed through the openings is in direct contact with an organic material, the adhesion between the substrate and the organic material can be increased.

Some of the advantages that may be achieved by exemplary embodiments of the invention of the invention include preventing or reducing cracks, which may be formed in the cut regions during manufacturing process, from propagating toward the inside of the display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate comprising:
      a display area; and
      a non-display area surrounding the display area;
   an inorganic layer disposed in the display area and the non-display area, the inorganic layer comprising openings disposed in the non-display area and exposing the substrate;
   a protruding portion disposed overlapping the openings, the protruding portion contacting the substrate exposed by the openings and comprising an organic material; and
   a passivation layer disposed on the inorganic layer, the passivation layer contacting the protruding portion.

2. The display device of claim 1, wherein the inorganic layer comprises a buffer layer.

3. The display device of claim 2, further comprising:
   a gate insulating layer; and
   an interlayer insulating layer disposed on the buffer layer,
   wherein the gate insulating layer and the interlayer insulating layer do not overlap the openings.

4. The display device of claim 1, wherein the openings are disposed along a periphery of the substrate.

5. The display device of claim 4, further comprising a driver which is disposed on a driver side of the substrate, wherein the openings are disposed on sides other than the driver side.

6. The display device of claim 4, wherein the openings are arranged at regular intervals.

7. The display device of claim 1, wherein the protruding portion comprises:
   a first protrusion; and a
   second protrusion disposed on the first protrusion.

8. The display device of claim 7, wherein a maximum width of the second protrusion is larger than that of the first protrusion.

9. The display device of claim 8, wherein the second protrusion completely covers an upper surface and both side surfaces of the first protrusion.

10. The display device of claim 7, wherein a maximum width of the second protrusion is smaller than that of the first protrusion.

11. The display device of claim 10, wherein side surfaces of the second protrusion are aligned with the side surfaces of the first protrusion.

12. The display device of claim 7, further comprising:
a via layer disposed on the inorganic layer; and
a pixel defining layer disposed on the via layer,
wherein the via layer and the first protrusion comprise the same material.

13. The display device of claim 1, wherein the passivation layer comprises a first inorganic material layer, an organic material layer and a second inorganic material layer stacked sequentially.

14. The display device of claim 13, wherein the first inorganic material layer and the second inorganic material layer contact the protruding portion.

15. The display device of claim 14, wherein an outer side surface of the protruding portions are disposed closer to the respective sides of the substrate than edges of the first inorganic material layer and the second inorganic layer.

16. The display device of claim 1, wherein the inorganic layer comprises a buffer layer, a gate insulating layer, and an interlayer insulating layer sequentially stacked.

17. A display device comprising:
a substrate comprising: a display area; and a non-display area surrounding the display area;
an inorganic layer disposed on the substrate, the inorganic layer comprising openings disposed in the non-display area and exposing the substrate in the non-display area;
a via layer disposed on the inorganic layer in the display area;
a pixel defining layer disposed on the via layer in the display area;
a protruding portion overlapping the openings and contacting the substrate exposed through the openings; and
a passivation layer disposed on the pixel defining layer, the passivation layer contacting the protruding portion,
wherein the protruding portion comprises:
a first protrusion comprising the same material as the via layer; and
a second protrusion disposed on the first protrusion, the second protrusion comprising the same material as the pixel defining layer.

18. The display device of claim 17, wherein the inorganic layer comprises a buffer layer.

19. The display device of claim 17, wherein the passivation layer comprises a first inorganic material layer, an organic material layer and a second inorganic material layer sequentially stacked.

20. The display device of claim 19, wherein an outer side surface of the protruding portions are disposed closer to the respective sides of the substrate than edges of the first inorganic material layer and the second inorganic layer.

* * * * *